United States Patent
Ludwig et al.

(10) Patent No.: US 7,665,051 B2
(45) Date of Patent: Feb. 16, 2010

(54) METHOD AND DEVICE FOR CLASSIFYING CELLS IN A LAYOUT INTO A SAME ENVIRONMENT AND THEIR USE FOR CHECKING THE LAYOUT OF AN ELECTRONIC CIRCUIT

(75) Inventors: Burkhard Ludwig, Munich (DE); Uwe Mueller, Munich (DE)

(73) Assignee: Qimonda AG, Munich (DE)

( * ) Notice: Subject to any disclaimer, the term of this patent is extended or adjusted under 35 U.S.C. 154(b) by 195 days.

(21) Appl. No.: 11/832,465

(22) Filed: Aug. 1, 2007

(65) Prior Publication Data

US 2008/0059927 A1    Mar. 6, 2008

(30) Foreign Application Priority Data

Aug. 1, 2006    (DE) .................... 10 2006 037 162

(51) Int. Cl.
*G06F 17/50*    (2006.01)
*G06F 9/45*    (2006.01)

(52) U.S. Cl. .................. 716/5; 716/4; 716/8; 716/9; 716/10; 716/11; 716/19; 716/20; 716/21; 430/5; 430/30

(58) Field of Classification Search ................ 716/4–5, 716/8–11, 19–21; 430/5, 30
See application file for complete search history.

(56) References Cited

U.S. PATENT DOCUMENTS

| 5,249,134 | A | 9/1993 | Oka |
| 6,308,143 | B1 * | 10/2001 | Segawa ................. 703/1 |
| 7,024,640 | B2 * | 4/2006 | Buchanan .............. 716/4 |
| 2003/0154461 | A1 * | 8/2003 | Pierrat ................. 716/21 |
| 2003/0159120 | A1 | 8/2003 | Baader et al. |

* cited by examiner

*Primary Examiner*—Jack Chiang
*Assistant Examiner*—Nghia M Doan
(74) *Attorney, Agent, or Firm*—Slater & Matsil, L.L.P.

(57) ABSTRACT

A method and a device can be used for checking the layout of an electronic circuit of a semiconductor component. For example, the method includes an automatic classification of cells in at least one layout into a cell database, and an automatic layout checker comparing the cell database to a layout to be checked.

16 Claims, 17 Drawing Sheets

101

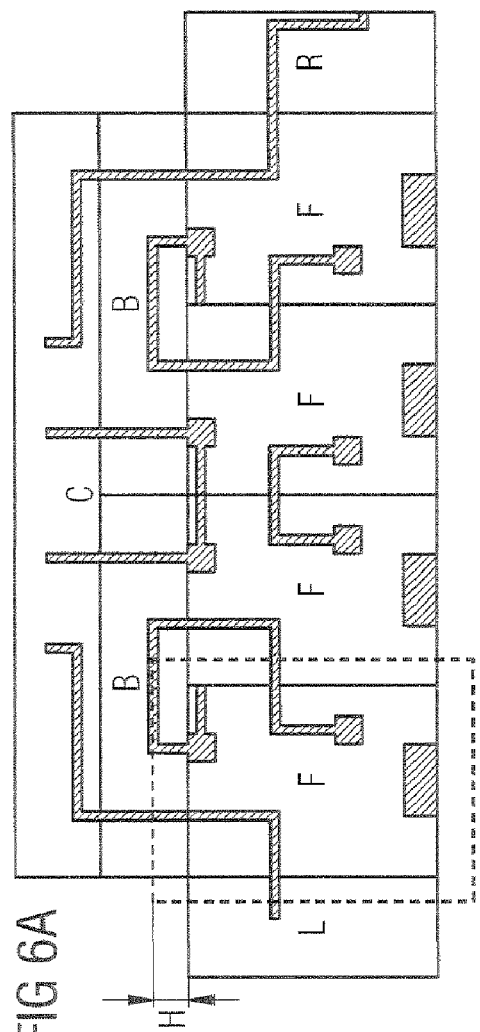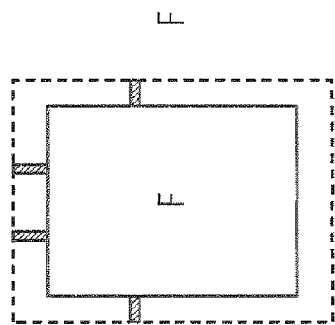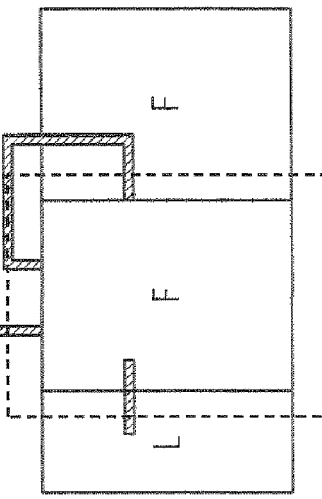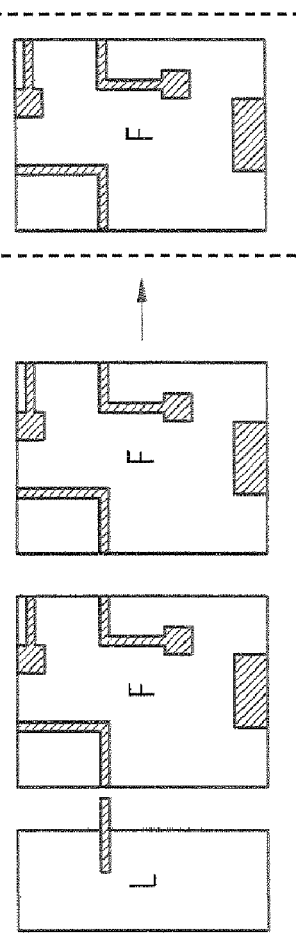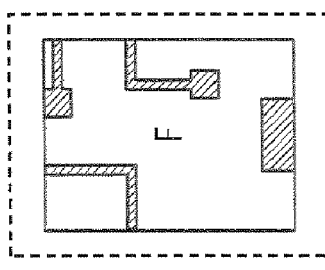

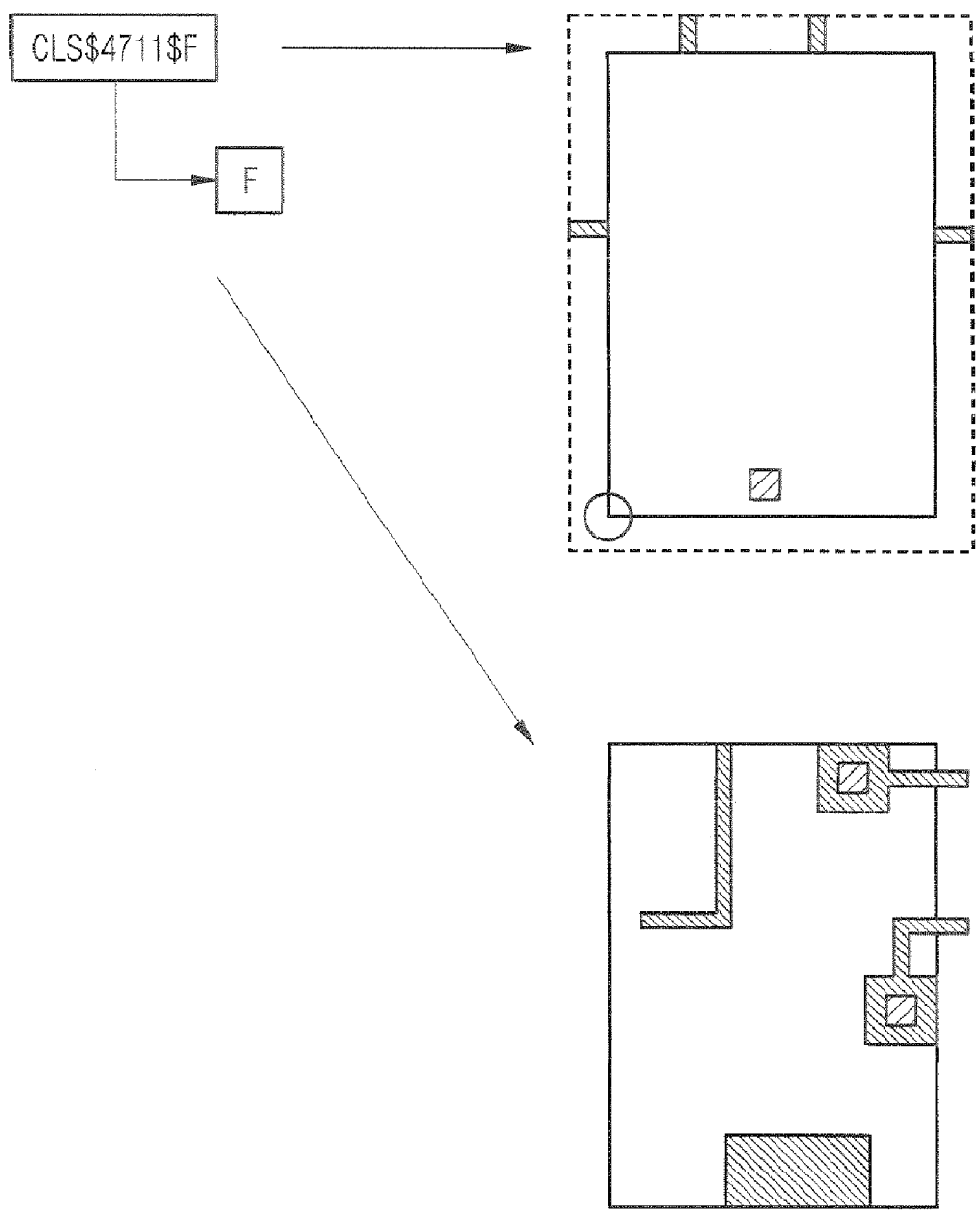

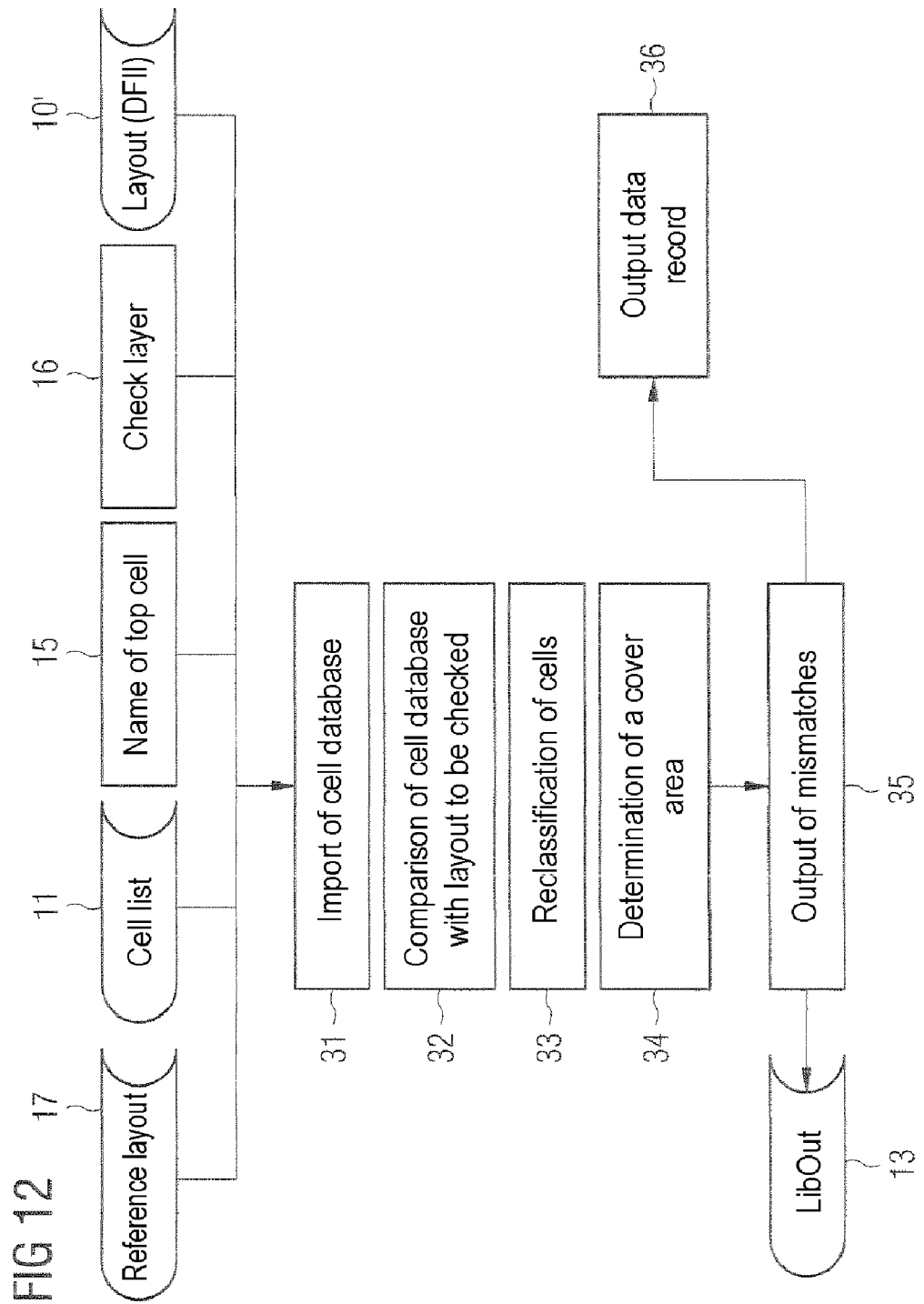

FIG 13A
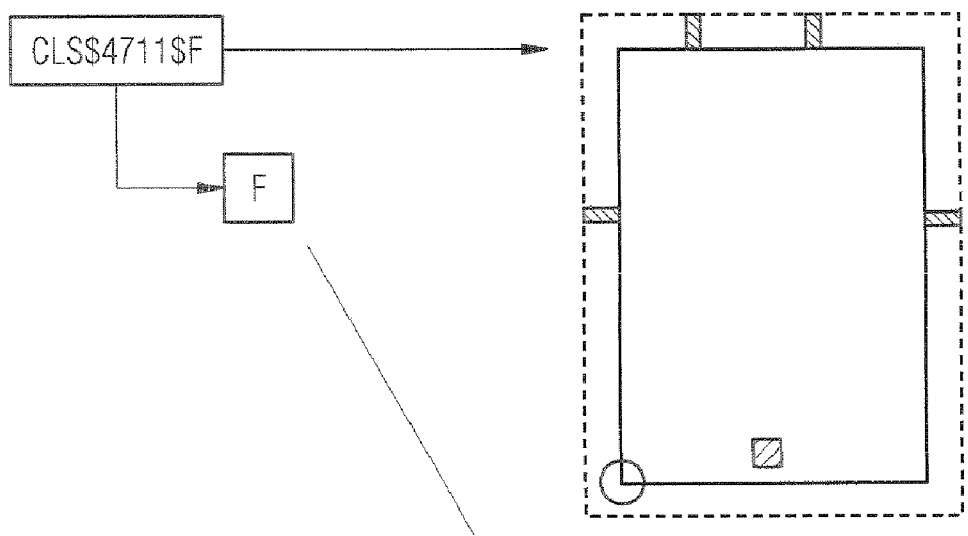
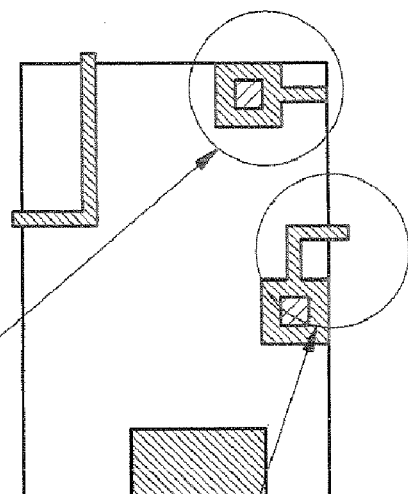
FIG 13B
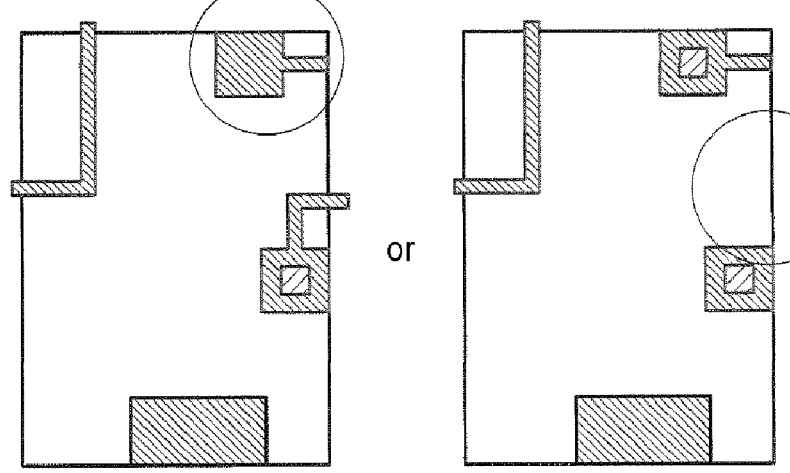
or

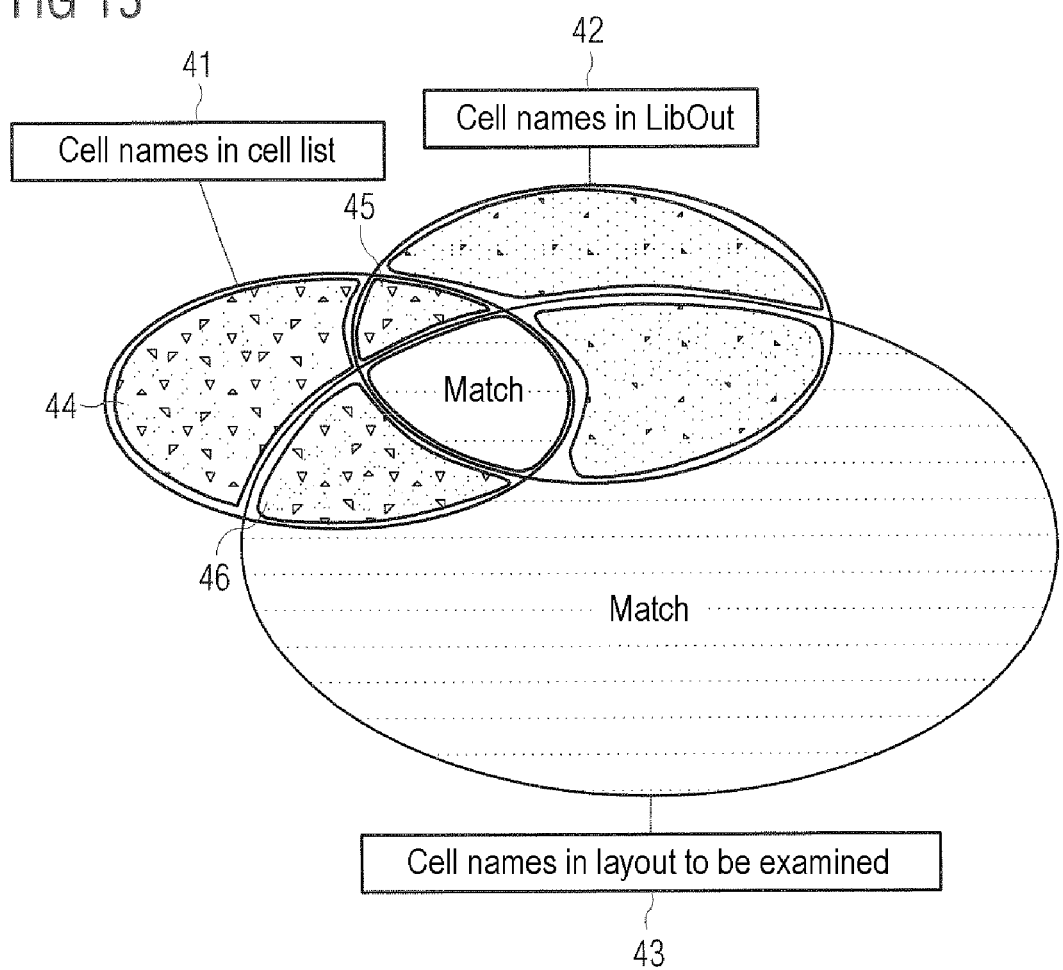

METHOD AND DEVICE FOR CLASSIFYING CELLS IN A LAYOUT INTO A SAME ENVIRONMENT AND THEIR USE FOR CHECKING THE LAYOUT OF AN ELECTRONIC CIRCUIT

This application claims priority to German Patent Application 10 2006 037 162.3, which was filed Aug. 1, 2006, and is incorporated herein by reference.

TECHNICAL FIELD

An embodiment of the invention relates to a method for checking the layout of an electronic circuit and a device for checking an electronic circuit.

BACKGROUND

The layout design, which defines the functionality of the circuit, is present at the start of the fabrication process of highly integrated electronic circuits for semiconductor components (e.g., DRAM). The layout specifies the physical implementation of the circuit, e.g., on a silicon wafer.

Known methods for fabricating the circuit on the wafer are based on lithography, i.e., a process that involves, among other steps, making an image of the circuit layout first on a mask and then exposing the mask to produce an image on the wafer.

The chip is fabricated in many steps. Each of the fabrication steps has an intrinsic inaccuracy, which ideally should be taken into account back in the layout design. Rules (known as design or layout rules) are provided for this purpose, which must be observed in the layout design in order to ensure that the layout can actually be fabricated later. For example, such layout rules may define the minimum distance between two transistors or the width of metal tracks.

Once the layout design is finished, the layout is checked on the basis of these layout rules (DRC design rule check), and corrected if necessary. This step is called verification and is performed by computers. Since the components of an integrated circuit are represented in the layout by polygons, the layout rules relate to the geometrical properties of polygons and to their geometrical relationships with one another. For example, a diode comprising a p-type and an n-type region is represented in the layout by touching rectangles.

In the simplest case, a layout rule can relate to a single dimension. Complex layout rules, on the other hand, relate a large number of dimensions to each other.

Complex layout rules mostly have to be formulated using numerous instructions, thereby increasing the computing time to an unwanted degree. Some layout rules are even formulated so that the instruction set of the verification software is not adequate, and "dummy errors" (supposed errors) must be tolerated. Dummy errors mean that the geometrical rules no longer apply in all areas of a chip layout.

There is also the problem that when there are many complex processes, the number of dummy errors increases so steeply that the "true" errors are no longer identified.

Another problem is that in practice, verification of a layout must be performed in some areas using a lithography simulation, because verification using conventional DRC is no longer sufficient. Thus, two methods that are not integrated with each other are required for verification, which drives up verification costs. In addition, it is no longer possible to prove unequivocally that a layout is correct, because different verifications are used.

These problems mean that manual inspections or other "exceptional operations" need to be performed. Hand-drawn wafer layers or cataloguing of known error patterns are used for this.

SUMMARY OF THE INVENTION

In one aspect, the present invention reduces these problems. For example, a method for checking the layout of an electronic circuit of a semiconductor component, comprises, in a cover test, automatically identifying a classification of cells in at least one layout into environments of the cells at least from a cell list and the at least one layout, with the environments being defined such that cells of the at least one layout whose interfaces with other cells are identical are assigned to an environment. Further, information on the environments is stored in a cell database, and a layout is then checked by making a comparison in a preDRC step between the layout to be checked and information in the cell database, where matches and mismatches are identified automatically.

BRIEF DESCRIPTION OF THE DRAWINGS

The invention is described in greater detail below from a plurality of exemplary embodiments with reference to the figures of the drawings, in which:

FIGS. 6A to 6E show steps for generating a cell class;

FIG. 11 shows an example of a reference cell;

FIG. 12 shows an overview of the second program block, preDRC;

FIGS. 13A and 13B, collectively as FIG. 13, show an example of cell mismatches;

FIG. 15 shows a Venn diagram to illustrate the matches and mismatches;

DETAILED DESCRIPTION OF ILLUSTRATIVE EMBODIMENTS

Figure 3:
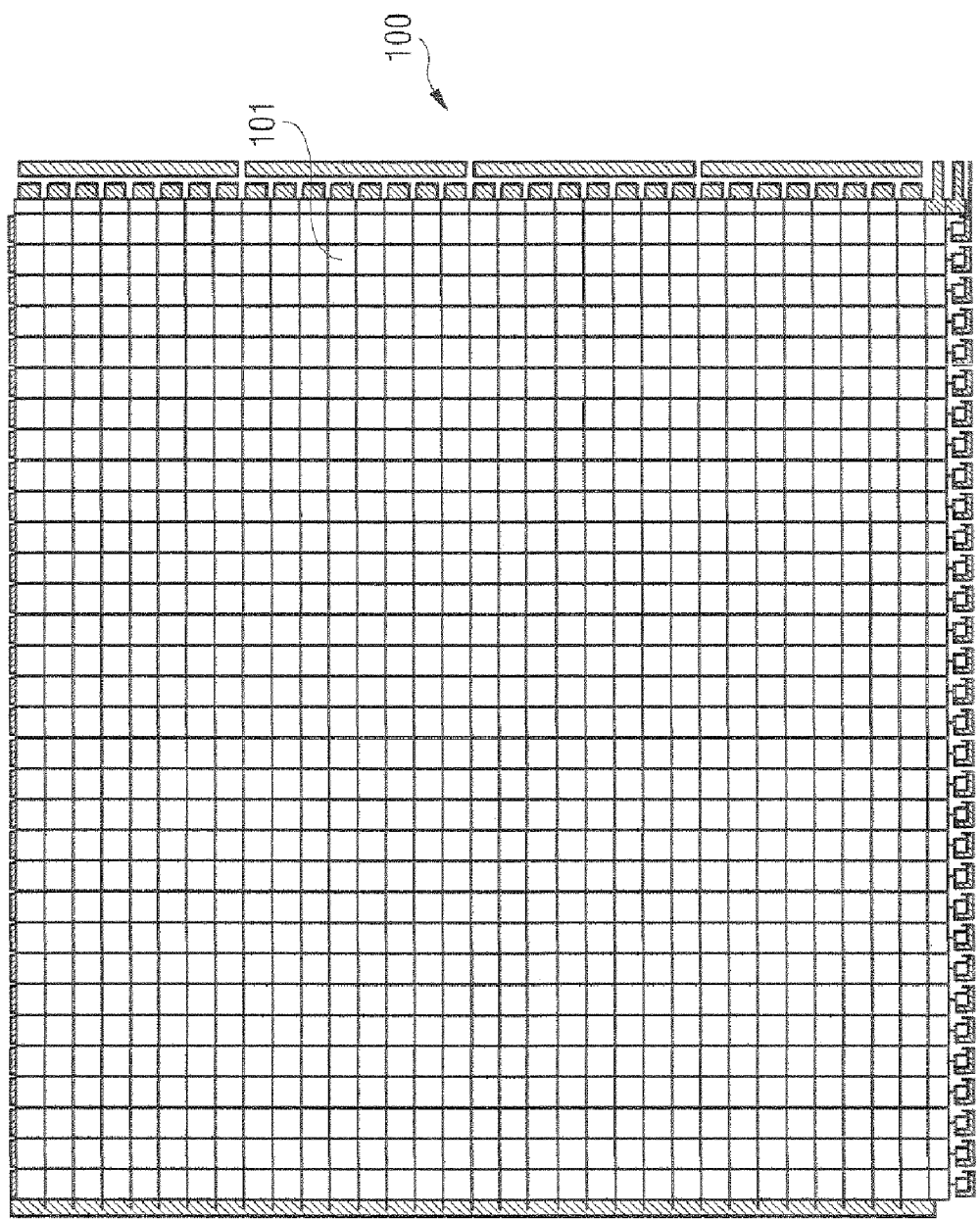
FIG. 3 shows an example of a layout containing repetitions of structures.

An array is used below by way of example as a special case of a layout for purposes of explanation without loss of generality. An array is understood to mean here a highly regular layout such as a memory area of a DRAM memory chip. Such an array is shown in FIG. 3. The method and also the device can be applied generally to layouts.

The embodiments described here of the method according to the invention are based on three verification steps A, B, C, which are described in more detail below.

A) A cover test checks to what extent a layout must be covered by simulations. This involves storing what can be simulated, or is simulated, for an error search. For this purpose, the simulated layout geometry is stored in a cell database 13 (LibOut).

B) The cell database 13 (LibOut) is used, amongst other things, in a subsequent step, the Pre Design-Rule-Check (Pre-DRC).

C) A conventional and/or even a modified Design Rule Check (DRC) is then advantageously performed.

All three steps (A, B, C) are described in detail below. The fundamental point above all is the combination of the two first verification steps A and B. Before steps A, B, C are described, the combination of these steps is described with reference to FIG. 1.

Figure 1:
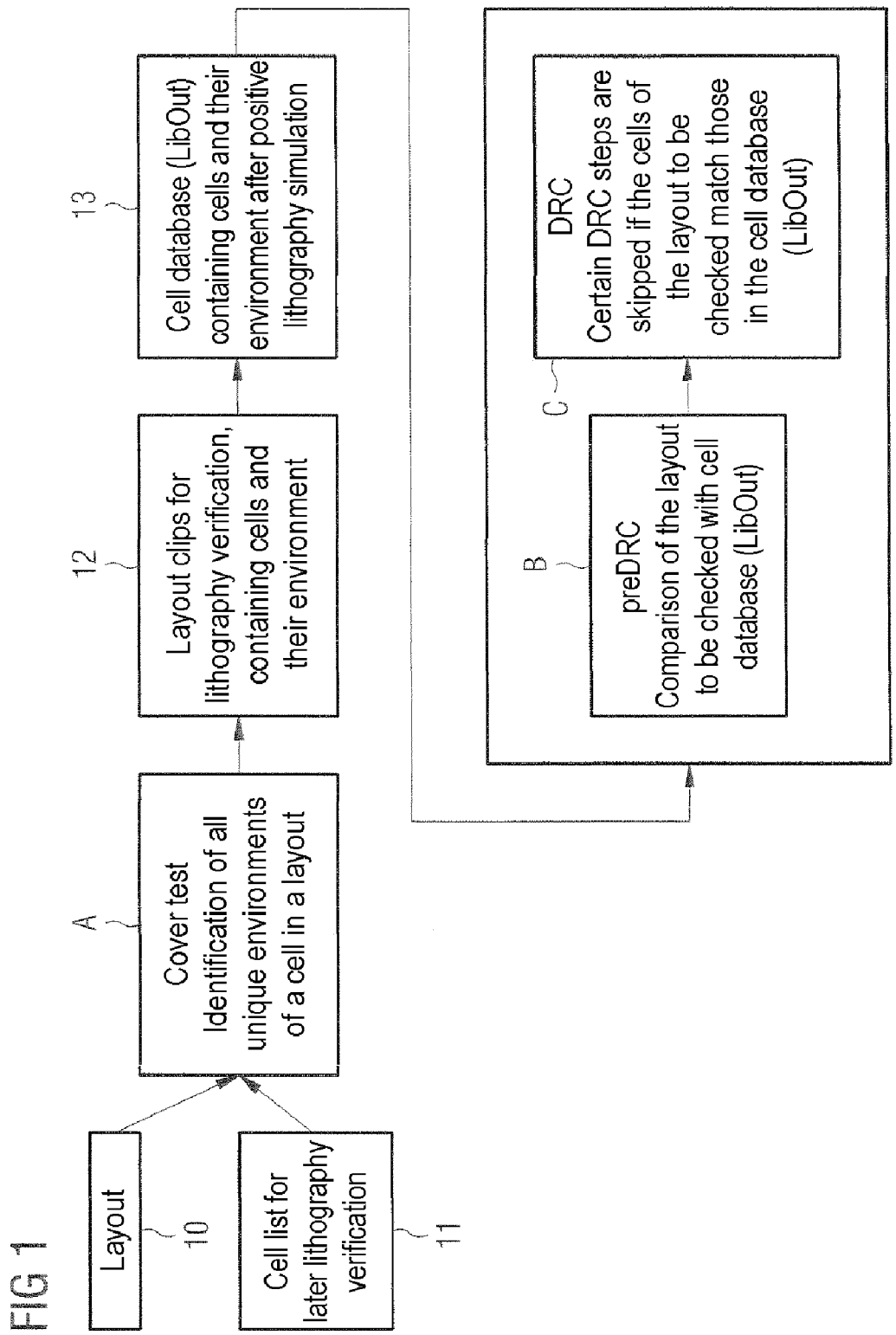
FIG. 1 shows a top-level flow diagram of an embodiment of the method according to the invention.

FIG. 1 shows that the essential input for step A (the cover test) is the import of one or indeed more layouts 10 and the cell list 11.

The aim of the cover test A is to find environments in which cells repeatedly occur, so that the subsequent steps can be simplified.

Layout clips 12 are generated as the output.

The generation of a database, the cell database (LibOut) 13, which contains, amongst other things, the environments of the cells, is important for what follows. In addition, the cell database (LibOut) 13 contains classes that were identified during the cover test A.

This cell database (LibOut) 13 is then imported with a layout 10' to be checked into the PreDRC (see FIG. 12). Here the layout to be checked and the cell database (LibOut) are compared. The layout 10' to be checked may be a re-development, for example, of a layout 10 already examined earlier, with parts of the earlier layout 10 having been adopted in the layout 10' to be examined.

Finally, as an advantageous step, a DRC known per se follows as step C. In this step, certain DRC rules can be skipped if the cells in the layout 10' to be examined match those of the cell database (LibOut) 13.

It is assumed that each of the steps are executed automatically, i.e., by a computer program or a microprocessor.

Figure 2:
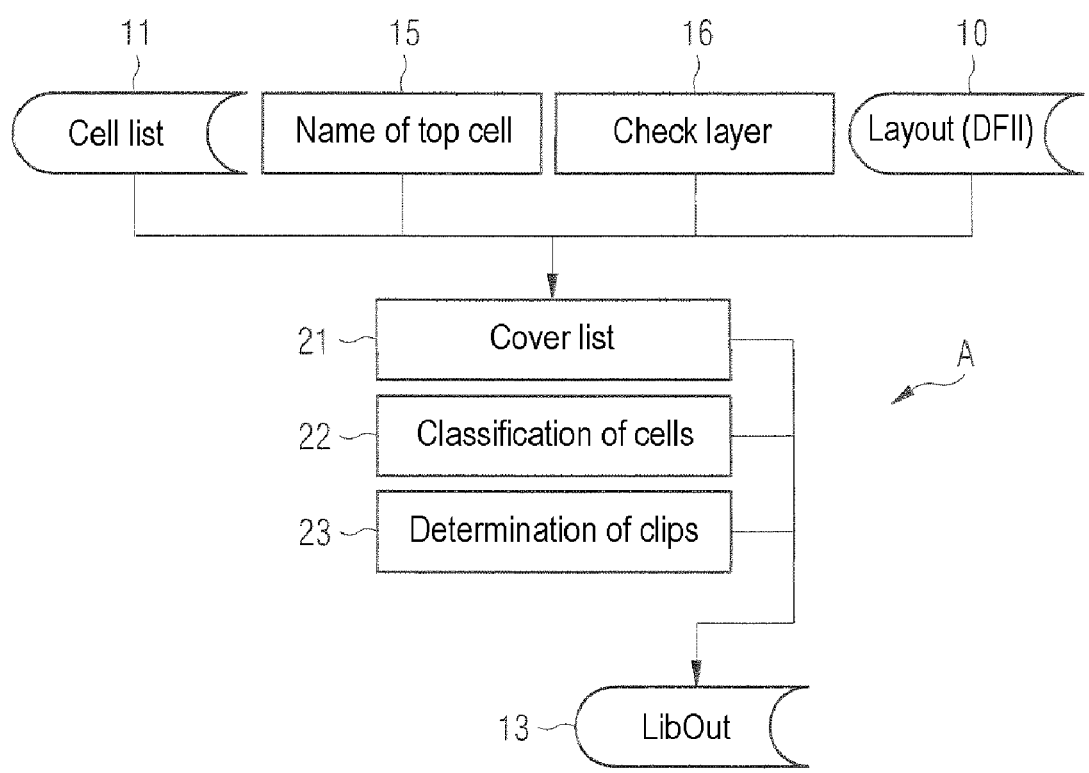
FIG. 2 shows an overview of the first program block of an embodiment.

A) Cover test (see FIG. 2).

The cover test A is based on the following input:

A cell list 11. The cell list 11 already contains a list of cells that are to be checked. Cells that are to be checked only using geometric rules are not included in this cell list.

A representation of a layout 10, e.g., in the form of a DFII database.

The name of a top cell 15 in the layout 10 and the designation of at least one check layer 16 (i.e., the name of the layer currently being checked).

The following three steps are performed using this input:

1. Creation of a cover list 21 from the cell list 11. The cover list 21 is generated from the cell list 11, from which the bounding boxes of the cells can be determined. The covered area in the layer to be simulated is then calculated from the bounding boxes. The layer obtained then represents those parts of the total layout that are covered by the simulation and that do not need to be checked by means of a standard DRC.

FIG. 3 shows an outline view of an array 100, in which the largest part 101 of the array is intended for simulation. Since the array has a very regular structure, i.e., a very large number of repetitions occur, only certain cells of the array need to be simulated, for example word-line drivers or sense amplifiers.

Figure 4:
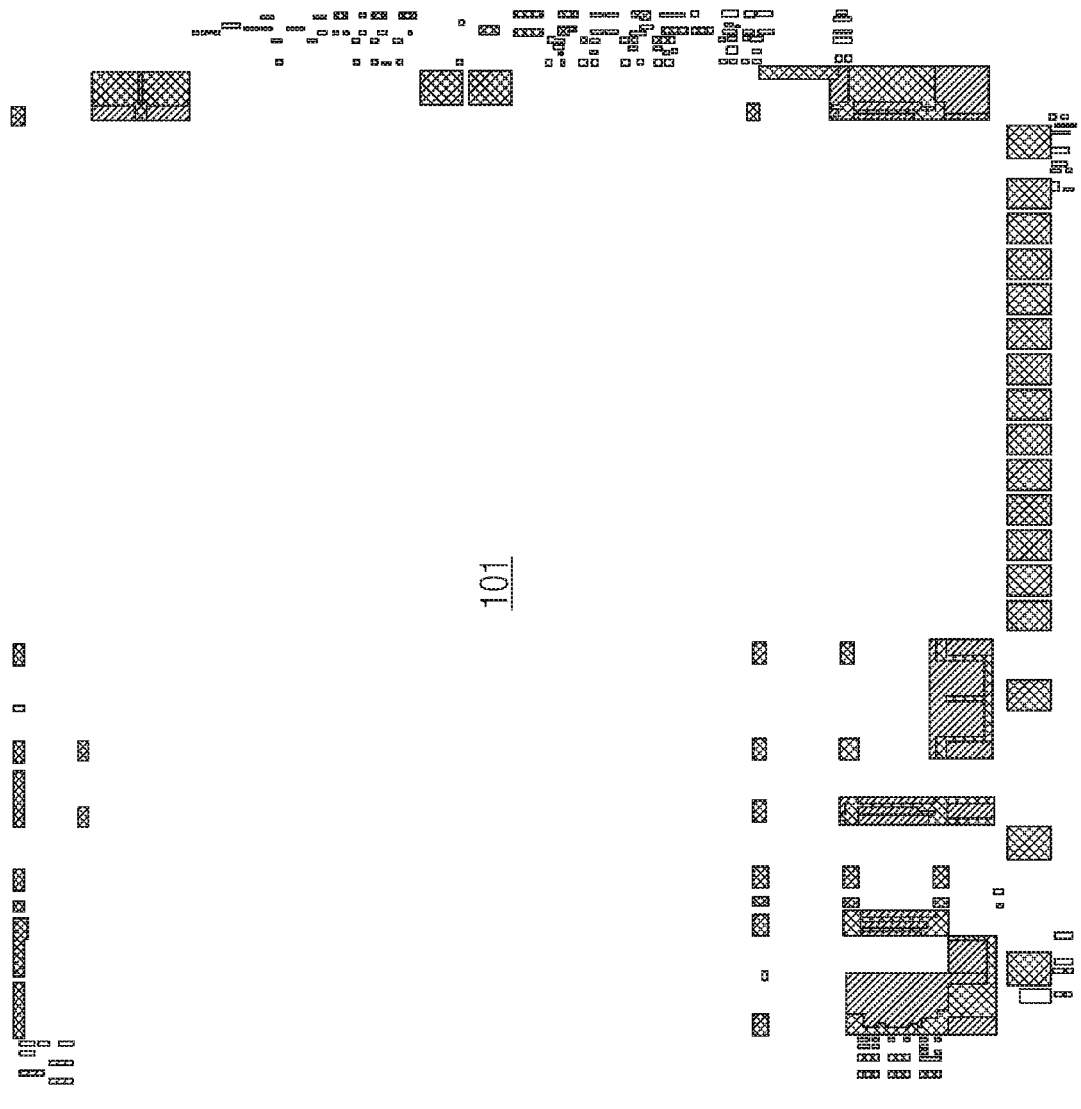
FIG. 4 shows the example of FIG. 3 without repetitions.

FIG. 4 shows the array of FIG. 3, where the cell instances 101 that no longer need to be simulated because of repetitions have been omitted. The steps described below are used, amongst other things, to create a database that presents these repetitions and provides them for subsequent method steps B, C. This is exactly where the advantageous effects in various embodiments of the present invention are seen.

2. Classification of cells (method step 22 in FIG. 2).

If a cover is defined by a number of cells, each instance of each selected cell is analyzed in its specific environment. Instances within the same environment are automatically assigned to one cell environment class in each case; this is described separately below.

Figure 5A:
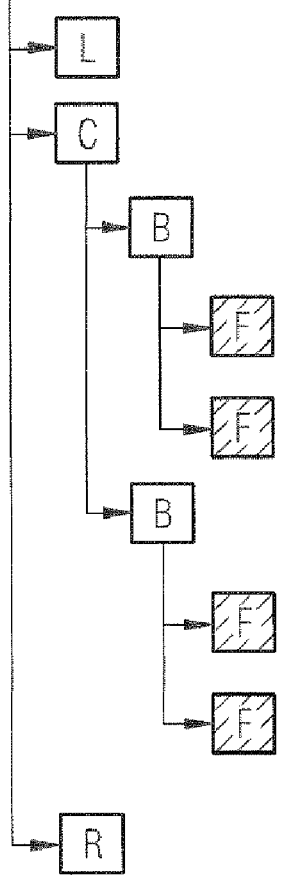
FIGS. 5A and 5B, collectively as FIG. 5, show representations of a hierarchical structure having four instances of a cell.

For each cell in the cell list, an environment is generated for each flat instance within a top cell. FIG. 5A shows a hierarchical structure of an example arrangement of cells L, C, R, B, F in a layout. Cells F are instanced in each cell B. Cells B are parent cells for cells F. Cells C are parent cells for cells B. The TOP cell is the parent cell for cells L, C and R.

Figure 5B:
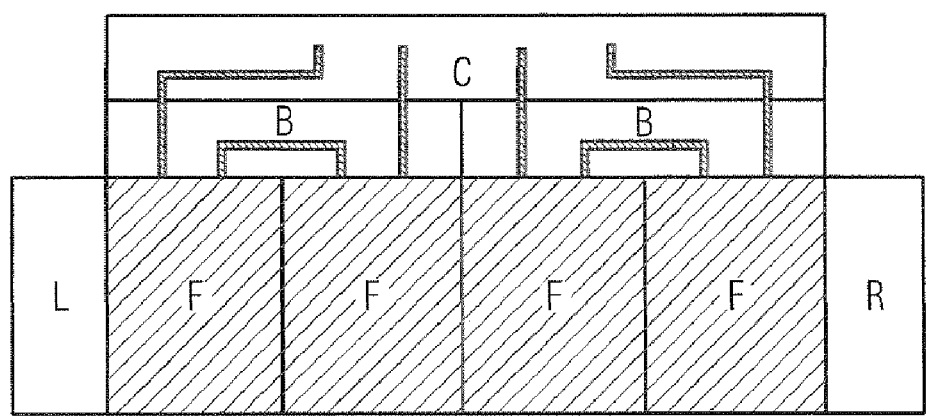

The hierarchical cell structure is portrayed in a different form in FIG. 5B, which shows the cell interconnects. In both cases, there are four instances of the cell F in the TOP hierarchy.

The terms check layer and reference layer are introduced for the explanation below. The check layer is the layer for which a lithography simulation is to be performed.

Reference layers are layers that are needed to assess the simulation result. The reference layer is, e.g., a contact-hole layer on which a check is made to find out whether a simulated layout also actually works.

The individual steps for constructing the cell environment are presented in conjunction with FIGS. 6A to 6E and FIGS. 7A to 7D.

FIG. 6A shows the same structure as FIG. 5B, where the check layer, i.e. the connection between the individual cells, is shown.

In a first step, a cell boundary (bounding box) is determined for each cell in the check layers and reference layers (the border of the left instance of cell F shown in bold in FIGS. 6A to 6E by way of example). The cell boundary encloses in particular all shapes (e.g. a contact or a track) located in the cell.

Then a halo is formed around each cell boundary by enlarging the cell boundary by a preset offset H. This is indicated in FIGS. 6A, 6C, 6D and 6E by a dashed box. The offset H is shown in FIG. 6A. The offset may equal 1 to 2 µm for example.

FIG. 6B shows an exploded view of the individual cells together with their interconnects. FIG. 6C shows the halo around the first instance of the cell F together with internal interconnects.

In the next step, geometrically adjacent cells are examined automatically by all parts of shapes lying inside the halo being apportioned to the cell, and all parts of shapes lying outside the halo being clipped. FIG. 6D shows the situation before clipping, and FIG. 6E shows the situation afterwards. From now on, the cell is only considered without the internal interconnects (compare, e.g., FIG. 6C with FIG. 6E) by these interconnects being removed from the representation.

This procedure is described in connection with FIGS. 7A, 7B, 7C and 7D. In FIGS. 7A, 7B, 7C, 7D, the reference layer is shown in addition to the check layer.

Figure 7A:
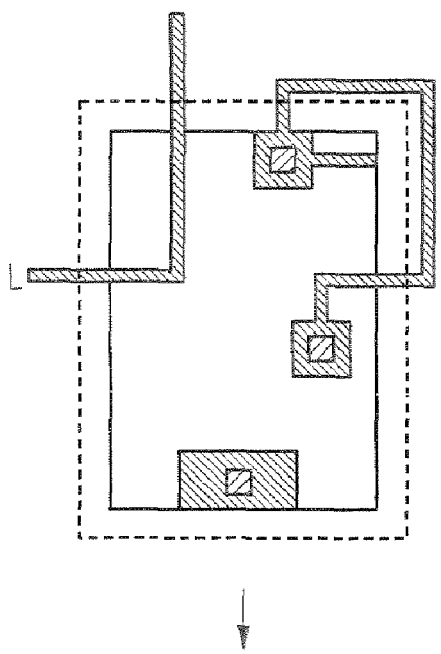
FIGS. 7A to 7D show steps for generating an environment.
Figure 7B:
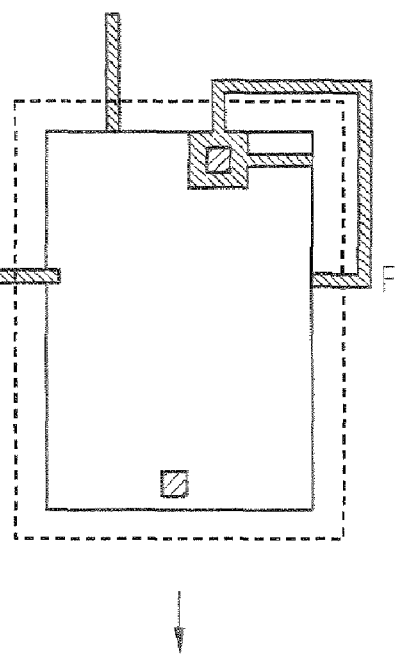
Figure 7C:
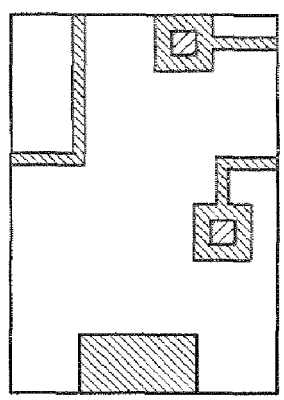
Figure 7D:
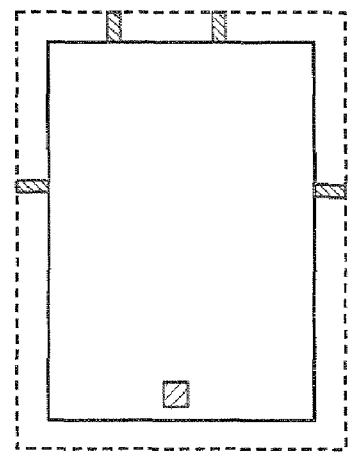

FIG. 7A shows the same cell as in FIG. 6C, i.e., including the internal interconnects. FIG. 7B shows the cell without the internal interconnects but with the shapes that result from the overlaps with adjacent cells. FIG. 7C shows only the internal interconnects of the cell. In a first step, clipping is performed around the dashed rectangle of FIGS. 7A and 7B, so that no shapes occur outside the dashed boundary in FIG. 7D. If one subtracts the structures of FIG. 7C in each separate layer from the clipped intermediate result (logical AND NOT), then a cell without internal interconnects is left (just one contact is left, shown by a square), with the interconnects inside the halo still remaining. FIG. 7D corresponds to FIG. 6E.

These steps are repeated for all the reference layers.

This reduced representation of the cell is called an environment.

These environments are normalized, e.g., all shapes of the environment are transformed into the coordinate system of the cell. This is done to make geometrical relationships comparable for a classification. This involves selecting a suitable coordinate system.

It turns out that in an array, a very large number of cells have the same environment, i.e., the cell as shown in FIG. 6E constitutes, e.g., a general type that also occurs in other positions of the array.

Classes are now created for each instance based on these environments. The cells can be compared with each other because of the normalization that was performed. A comparison allows the flat cell instances to be classified into cell environment classes. All cell instances of a class have the same environment (see, e.g., FIG. 6E). Conversely, cell instances from different classes have different environments.

Figure 8A:
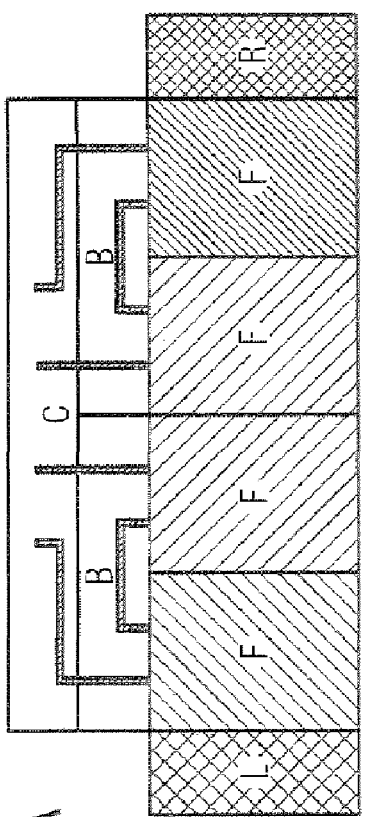
FIGS. 8A to 8D, collectively as FIG. 8, show examples of three cell classes.
Figure 8D:
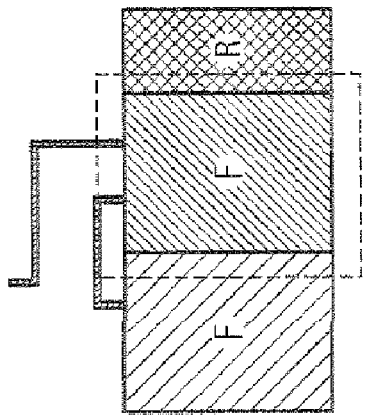
Figure 8C:
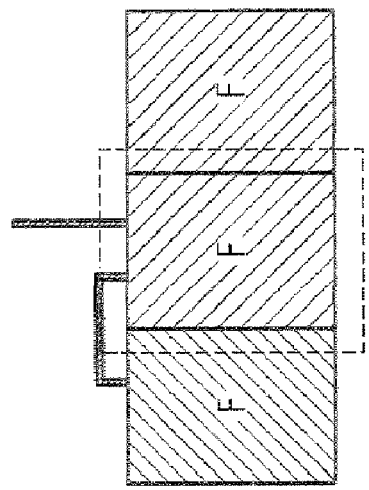
Figure 8B:
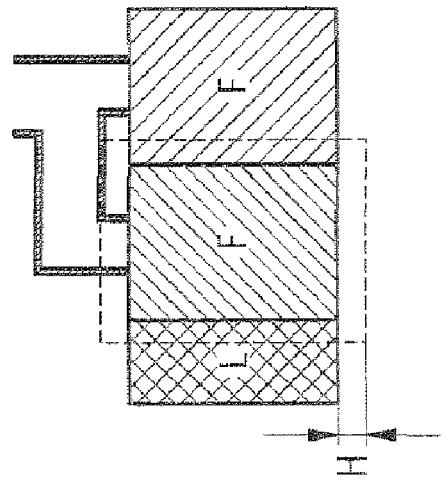

The classification of instances is shown in FIGS. 8A, 8B, 8C and 8D. FIG. 8A shows the layout in a similar way to FIG. 5A or 6A. What is interesting here is that four instances of the cell F can be grouped into three classes. The two central cells F (FIG. 8C) belong to the same class.

Figure 10:
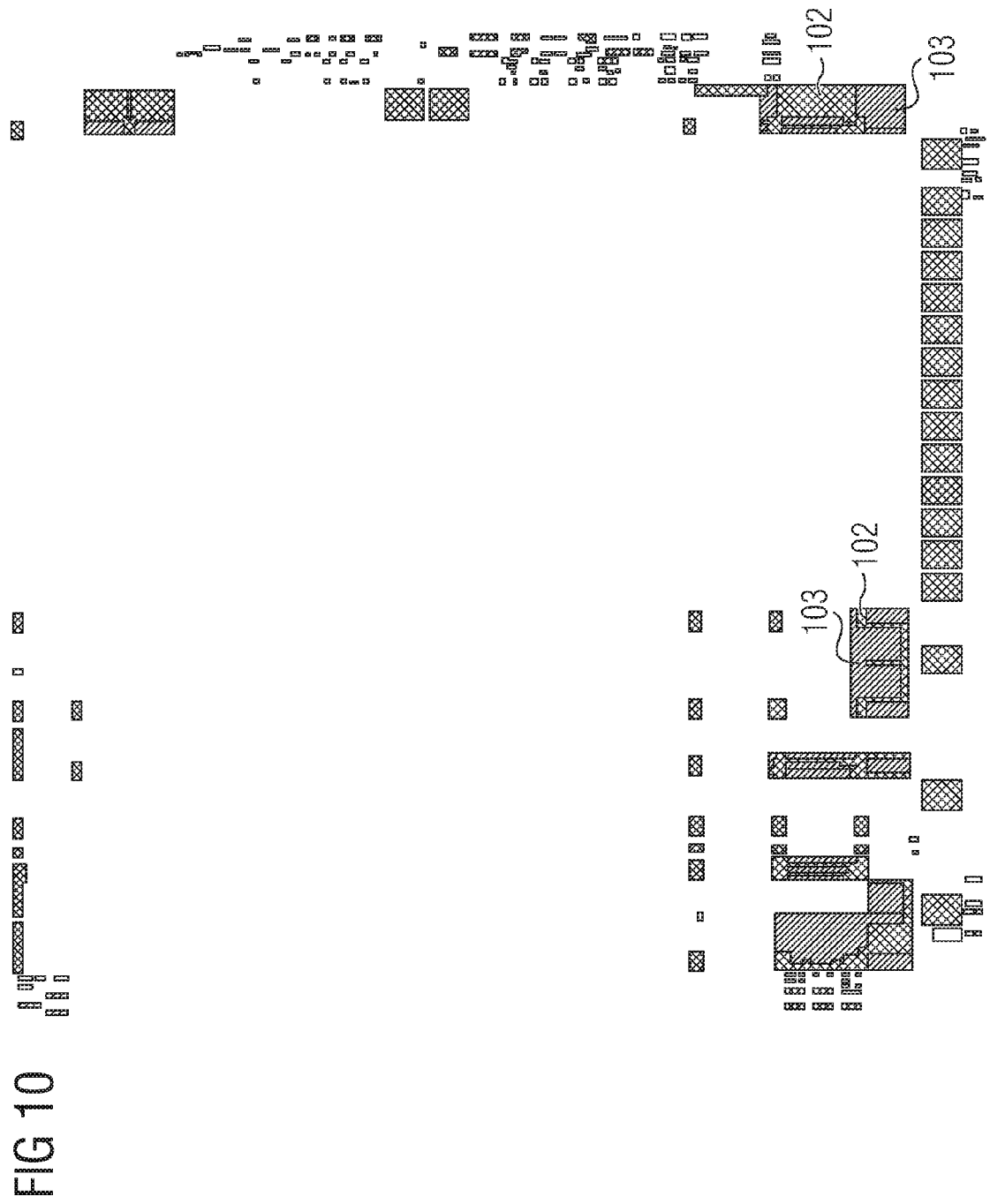
FIG. 10 shows an example of the class representatives.

A class representative 102 is selected for each class in the flattened-out layout (see cross-hatched areas in FIG. 10). This allows a class of cells to be selectively simulated using one example, which saves time.

3. Determining clips, in particular clusters, in the array (method step 23 in FIG. 2).

To simplify the simulation, it is advantageous to combine a plurality of cells. As described above, a plurality of class representatives are selected for this purpose. Class representatives 102 that are physically adjacent to each other are combined into clusters 103 (shaded areas in FIG. 10), so that these clusters 103 can undergo simulation as a whole.

If two class representatives 102 overlap or are separated by a distance less than an offset of a halo, they are combined into a cluster. In other words, two instances of different clusters 103 are always separated from each other by at least one halo offset.

Figure 9A:
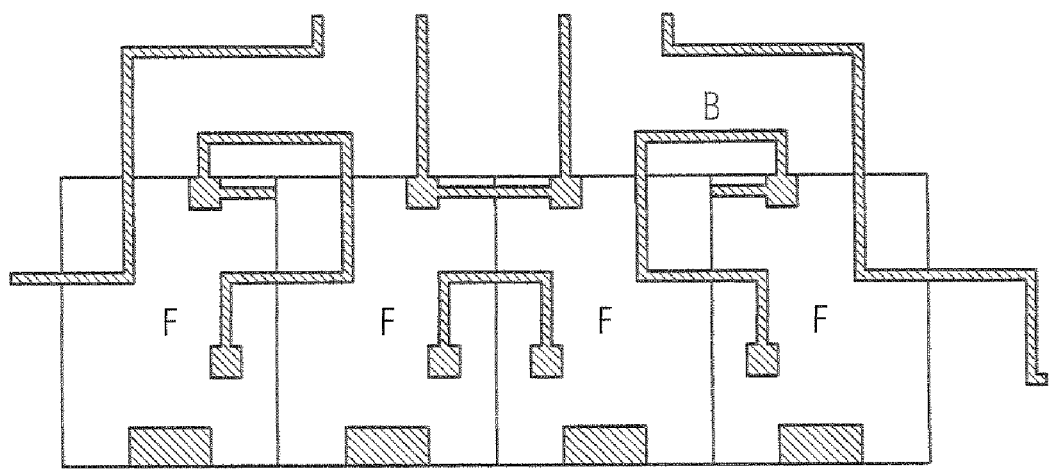
FIGS. 9A and 9B show examples of cell clusters.

The three class representatives 102 (see FIGS. 8B, 8C, 8D) are combined into a cluster in FIG. 9A.

Figure 9B:
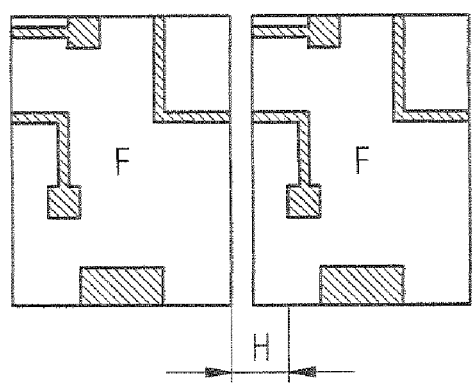

FIG. 9B shows a different example of a cluster, which is characterized by a certain distance of the halo.

FIG. 10 shows the same view as in FIGS. 3 and 4, where the clusters 103 (shaded areas) and the class representatives 102 (cross-hatched areas) are shown.

Each class cell contains the geometry of the corresponding class, the cell boundary (a rectangle), and an instance of a reference cell of the classified cell (automatic selection). This instance is placed at the origin of the classified cell (FIG. 11).

At the end of the three steps, the result is automatically stored in the class database (LibOut) 13. The class database (LibOut) 13 contains simulation data in addition to information about the identified cell classes. The cell classes that are fundamental to the embodiments of the invention describe all the environment classes that were identified by the method described above.

It is fundamental to the embodiment of the invention described here that a layout 10' to be checked undergoes a check using the class database 13 (LibOut) (which also contains data on other layouts); this check, the preDRC (see FIG. 12), precedes the actual DRC (see FIG. 1).

The preDRC (method step B in FIG. 1) advantageously comprises the following steps (see FIG. 12):

a) Import of cell database 31 of the class database (LibOut) 13. The class database (LibOut) 13 is used as a reference layout 17 for the check. In addition, the name of the top cell 15 and the cell list 11 are read out, these having been determined in an earlier run using one of the previous steps (FIGS. 2 to 10). An import of the chip layout 10' to be examined is also performed.

b) Automatic comparison 32 of each reference cell in the class database (LibOut) 13 with the corresponding cell on the chip layout 10' to be examined. The reference cell is used to provide a template for the comparison, where a difference found in the comparison is recorded as an error. An example is that a 512 MB memory chip is used as the reference layout 17 (contained in the LibOut), where the layout 10' to be examined has a 1 GB layout. Even if the two layouts 17, 10' are very different, there is still a large match between individual cell classes, so that the simulation of the 1 GB layout is simplified. The time involved can be reduced significantly by using the preDRC.

c) Automatic identification, reclassification of cells 33 of new classes for all cells in the cell list 11 having the chip as the top cell. The same methods as were described above in connection with FIG. 8 are used, amongst other methods, to determine the classes. The preDRC works on the basis of the known cell classes here.

d) Automatic identification of mismatches 35 between the class database (LibOut) 13 (i.e., the reference layout), the cell list 11 and the chip layout 10' to be examined. The mismatches (as, e.g., explained in the example above) are described in more detail with reference to FIGS. 13, 14 and 15.

e) Automatic determination of a cover area 34 (see, e.g., FIG. 16).

Step e) can also be performed before step d). Alternatively, both steps can also be performed in parallel.

Three mismatches identified by the preDRC are considered below.

FIG. 13 shows a cell-layout mismatch. A cell-layout mismatch exists when the geometry of the cell layout on the chip differs from the geometry of the reference cell (FIG. 11) in the cell database (LibOut) 13. If such a mismatch occurs, this means that the cell database does not describe the same array/layout that is being examined; it must be corrected to some extent.

The mismatch between the layouts 17, 10' is determined, e.g., by an EXOR step.

FIG. 13A shows that a reference copy of a cell F is held in the cell database (LibOut). FIG. 13B shows two cells that are located in the layout 10' to be examined. Both differ from the reference copy in terms of their geometry, which results in a mismatch that is identified by the preDRC.

Another form of a mismatch to be identified is shown in FIGS. 14A-14D. This involves a mismatch in environments. This occurs when a class is identified during examination of the layout 10' that does not match a class in the cell database (LibOut) 13.

Figure 14C:
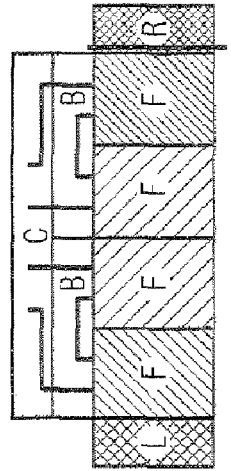
FIGS. 14A to 14D show an example of an environment mismatch.
Figure 14D:
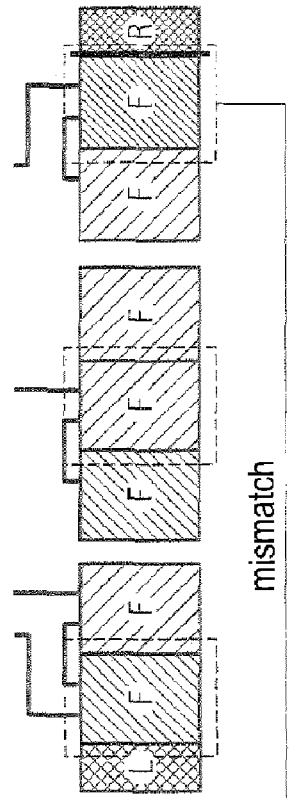
Figure 14A:
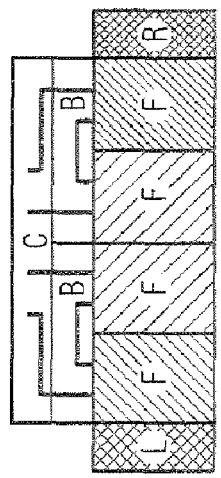
Figure 14B:
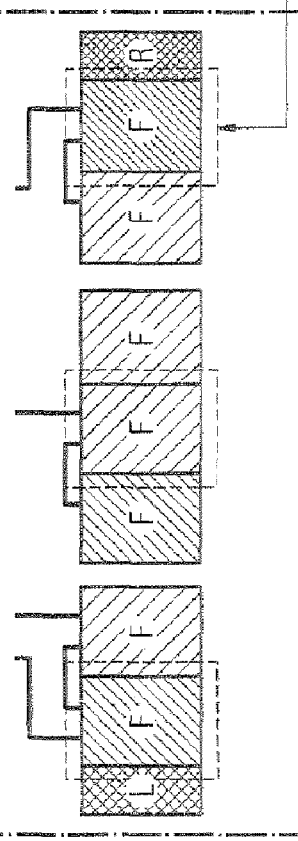

FIG. 14A shows the layout 17 that has resulted in the classification in the cell database (LibOut) (FIG. 14B). This is the same as the example that was already presented in connection with FIG. 8.

In the analysis of the chip layout 10' to be examined (FIG. 14C), it is found that an environment does not match an environment in the cell database (LibOut) 13. This is an instance of a new class. As explained above, a mismatch is assessed as an error here, so that a separate check is necessary.

This is a fundamental outcome of the embodiment of the method according to the invention.

Another mismatch identified by the preDRC are differences in the cell names, where differences can exist between the layout to be checked and the cell list, and between the cell database (LibOut) and the cell list.

Referring to FIG. 15, the first set 41 contains all the cell names of the cell list, the second set 42 contains all the cell names of the cell database (LibOut), and the third set 43 contains all the cell names of the layout to be examined.

A fourth set 44 contains all the cells that are cited in the cell list but do not occur in the layout 10' to be examined.

A fifth set 45 contains all the cells that are contained in the LibOut, but not in the cell list.

A sixth set 46 contains all the cells that are contained in the layout 10' to be examined and the cell list, but not in the LibOut.

The fourth, fifth and sixth set 44, 45, 46 are automatically identified as mismatches and hence treated as errors that require intervention by a user.

The cells that occur in the LibOut 13 but not in the cell list are not dealt with in this embodiment.

Figure 16A:
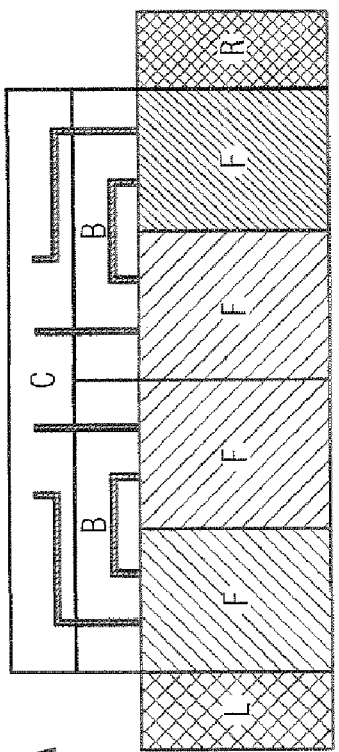
FIGS. 16A to 16C, collectively as FIG. 16, show an example of a cover.
Figure 16C:
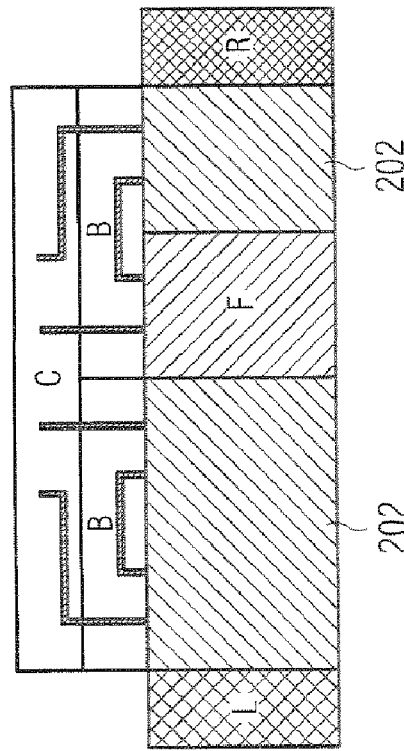
Figure 16B:
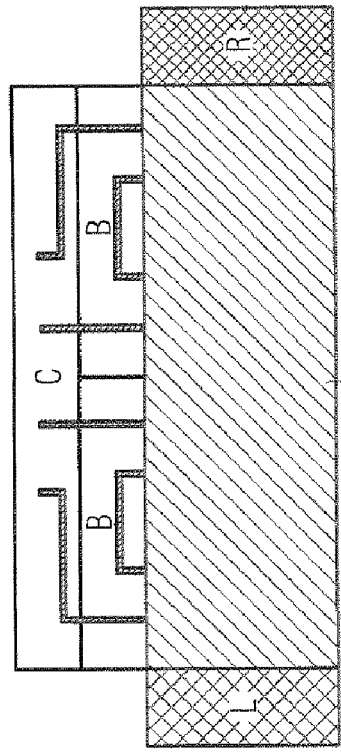

FIGS. 16A to 16C show how the identification of a new class (i.e., a mismatch between the previously stored layout 10 in the cell database LibOut 13 and the layout 10' to be examined) impacts on the creation of a cover.

FIG. 16A basically shows the same situation as in FIG. 5, having four instances of the cell F. The environment of the second cell F from the right has been modified, however, compared with the template, because there is a rectangular shape 200 (isolated). This leads to a new class, which is not included in the cell database LibOut 13.

FIG. 16B shows the cover 201 (shaded) that resulted from the cover test (FIG. 1, step A). The result of the mismatch is that the cover 202 is different for the modified layout in FIG. 16C, i.e., the modified cell drops out of the cover 202 after the preDRC (FIG. 1, step B) because it does not match what is known. As shown above, the same classification mechanism is always performed in the preDRC, so that the changed situation results in a new class.

After the preDRC step (B), a Design Rule Check (C) known per se is performed, where modifications can be made (see FIGS. 1, 17).

Figure 17A:
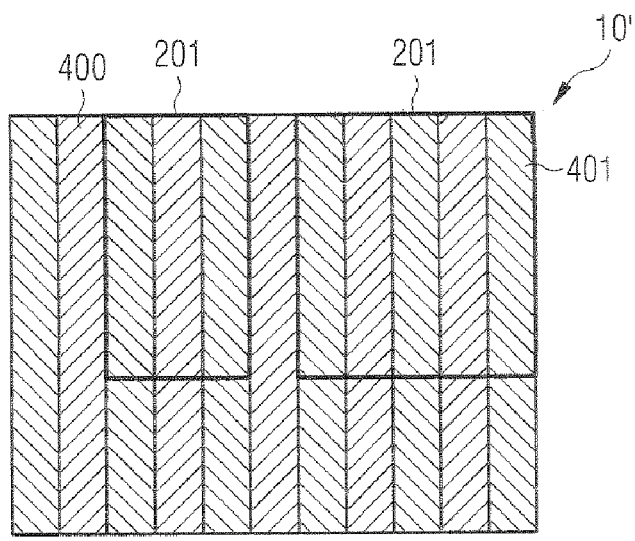
FIGS. 17A to 17C show an example of a DRC step after a preDRC step.
Figure 17B:
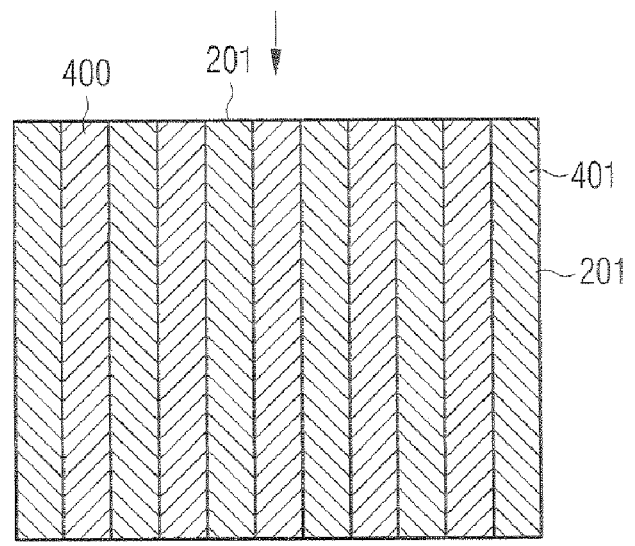
Figure 17C:
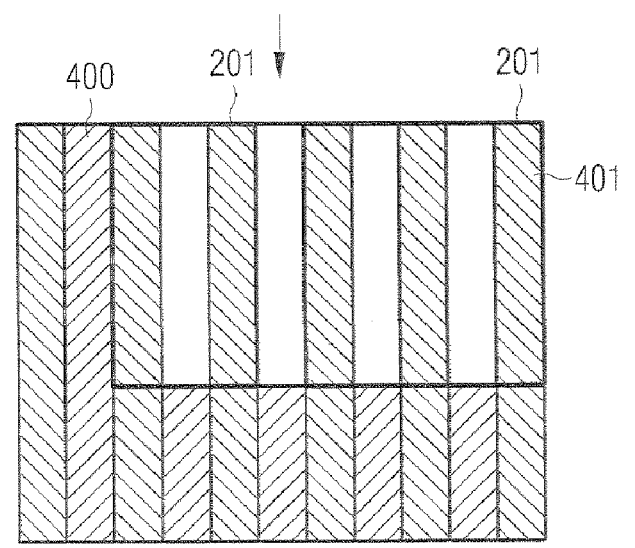

FIGS. 17A to 17C illustrate what effects the efficient structuring of a cover has on the subsequent DRC step.

FIG. 17A shows schematically a segment of a layout 10' to be examined. Within the regular pattern to be examined of the layout 10' there are areas that have been identified as errors 400. Two sections of the layout 10' to be examined are covered by covers 201 that were identified by the method described above.

FIG. 17B shows that a standard DRC, i.e., without covers, would need to take account of all errors, i.e., including a very large number of dummy errors.

If, on the other hand, one uses the covers 201, then it becomes apparent from FIG. 17C that there are significantly fewer areas whose dummy errors no longer need to be examined because they are covered by the covers 201. The embodiment shown here assumes that all the dummy errors that can be assigned to a cover drop out, so that even dummy errors lying between the covers 201 drop out.

The invention is not restricted in its embodiment to the preferred exemplary embodiments given above. In fact, a number of alternatives are possible that make use of the method according to the invention and the device according to the invention even for embodiments that are fundamentally different.

What is claimed is:

1. A method for checking a layout of an electronic circuit of a semiconductor component, the method comprising:

using a computer processing apparatus, reading in the layout and a corresponding cell list, the layout comprising a plurality of cells;

using the computer processing apparatus, enlarging a boundary for each cell in the plurality of cells by an offset distance to form a halo region disposed between the boundary and the enlarged boundary;

using the computer processing apparatus, determining an environment for each cell in the plurality of cells, wherein the environment includes all the interfaces from the cell to adjacent cells in the layout within the halo region around each cell;

using the computer processing apparatus, automatically identifying classes of cells in the layout, wherein cells with a same environment are assigned to a same class;

using the computer processing apparatus, storing the classes in a cell database; and using the computer processing apparatus, making a comparison in a pre-design rule check (preDRC) step between a layout to be checked and the cell database, where matches and mismatches are identified automatically.

2. The method as claimed in claim 1, wherein a design rule check is performed after making the comparison, wherein at least one rule in the design rule check is skipped for cells of the layout to be checked that match the information in the cell database.

3. The method as claimed in claim 1, wherein a cell representative is defined for each cell class in the layout to be examined.

4. The method as claimed in claim 3, wherein physically adjacent cell representatives are combined into a cluster.

5. The method as claimed in claim 1, wherein as part of the preDRC step, at least one mismatch is automatically identified in respect of the environment stored in the cell database and at least one environment in the layout to be examined.

6. The method as claimed in claim 1, wherein as part of the preDRC step, at least one mismatch is automatically identified in respect of the cell layout stored in the cell database and at least one cell layout in the layout to be examined.

7. The method as claimed in claim 1, wherein as part of the preDRC step, at least one mismatch is automatically identified in respect of a cell name stored in the cell database and at least one cell name in the layout to be examined.

8. The method as claimed in claim 1, wherein the cell database is designed as a self learning database, in which, in particular, information on environments of cells is learned.

9. The method as claimed in claim 1, wherein in a DRC step, mismatches between a reference layout and/or the cell database LibOut are assigned to a cover.

10. The method as claimed in claim 1, wherein the semiconductor component is a DRAM chip.

11. A device for checking a layout of an electronic circuit of a semiconductor component, the device comprising:

means for reading-in the layout and a corresponding cell list, the layout comprising a plurality of cells;

means for enlarging a boundary for each cell in the plurality of cells by an offset distance to form a halo region disposed between the boundary and the enlarged boundary;

means for determining an environment for each cell in the plurality of cells, wherein the environment includes all the interfaces from the cell to other cells within the halo region around each cell;

means for automatically identifying classes of cells in the layout, wherein cells with a same environment are assigned to a same class;

a cell database that stores on the classes of the cells; and comparison means for checking a layout to be examined in a pre-design rule check (preDRC) step, with a comparison being made between the layout to be examined and the cell database, where matches and mismatches are identified automatically by the comparison means.

12. The device as claimed in claim 11, wherein the device is used to reduce computing time in designing the layout of an electronic circuit.

13. The device as claimed in claim 12, wherein the electronic circuit is a DRAM chip.

14. A layout checker comprising a scheme for:

forming a halo region around each cell in a plurality of cells of a layout by enlarging a boundary for each cell in the plurality of cells by an offset distance, the halo region disposed between the boundary and the enlarged boundary;

determining an environment for each cell in the plurality of cells, wherein the environment includes all the interfaces from the cell to other cells within the halo region around each cell;

automatically identifying classes of cells in the layout, wherein cells with a same environment are assigned to a same class;

forming a cell database based on the identified classes; and automatically identifying matches and mismatches, for a layout to be checked, by comparing to the cell database, wherein the scheme comprises software to be run on a computer system.

15. The layout checker of claim 14, wherein a design rule check follows the use of the layout checker.

16. The layout checker of claim 15, wherein a rule check in the design rule check is skipped for cells of the layout to be checked that match the information in the cell database.

* * * * *